United States Patent
Wang et al.

(10) Patent No.: US 9,574,070 B2
(45) Date of Patent: Feb. 21, 2017

(54) AROMATIC TETRAFUNCTIONAL VINYLBENZYL RESIN COMPOSITION AND USE THEREOF

(71) Applicant: Elite Electronic Material (KunShan) Co., Ltd., Kunshan, Jiangsu Province (CN)

(72) Inventors: Rongtao Wang, Kunshan (CN); Chen-Yu Hsieh, Taoyuan (TW); Wenfeng Lv, Kunshan (CN); Wenjun Tian, Kunshan (CN); Yu Gao, Kunshan (CN); Ningning Jia, Kunshan (CN); Ziqian Ma, Kunshan (CN)

(73) Assignee: ELITE ELECTRONIC MATERIAL (KUNSHAN) CO., LTD., Kunshan, Jiangsu Province (CN)

( * ) Notice: Subject to any disclaimer, the term of this patent is extended or adjusted under 35 U.S.C. 154(b) by 0 days.

(21) Appl. No.: 14/731,008

(22) Filed: Jun. 4, 2015

(65) Prior Publication Data
US 2016/0160008 A1    Jun. 9, 2016

(30) Foreign Application Priority Data
Dec. 5, 2014   (CN) .......................... 2014 1 0736496

(51) Int. Cl.
C08K 5/5397    (2006.01)
C08J 5/24      (2006.01)
C08K 5/14      (2006.01)
C08J 5/18      (2006.01)
H05K 1/03      (2006.01)

(52) U.S. Cl.
CPC ............. C08K 5/5397 (2013.01); C08J 5/18 (2013.01); C08J 5/24 (2013.01); C08K 5/14 (2013.01); H05K 1/0326 (2013.01); C08J 2325/08 (2013.01); H05K 2201/012 (2013.01)

(58) Field of Classification Search
CPC ............ C08K 5/5397; C08K 5/14; C08J 5/18; C08J 5/24; C08J 2325/08

USPC .......................................................... 524/710
See application file for complete search history.

(56) References Cited

U.S. PATENT DOCUMENTS

| | | | | |
|---|---|---|---|---|
| 3,681,281 A | * | 8/1972 | Juelke .................. | C08K 5/5397 524/129 |
| 4,728,708 A | * | 3/1988 | Zupancic .............. | C07C 43/215 526/293 |
| 2009/0191387 A1 | * | 7/2009 | Paul ......................... | B32B 7/12 428/195.1 |
| 2014/0349090 A1 | * | 11/2014 | Hsieh ................... | H05K 1/0353 428/209 |

* cited by examiner

Primary Examiner — Ling Choi
Assistant Examiner — Ronald Grinsted
(74) Attorney, Agent, or Firm — Muncy, Geissler, Olds & Lowe, P.C.

(57) ABSTRACT

A low dissipation factor resin composition comprises the following components: (A) an aromatic tetrafunctional vinylbenzyl monomer, its prepolymer or a combination thereof, the aromatic tetrafunctional vinylbenzyl monomer having a structure shown below; (B) flame retardant; and (C) peroxide. The resin composition is applicable to laminates and printed circuit boards featuring low dissipation factor at high frequency and thermal resistance and thermal expansion meeting the demands.

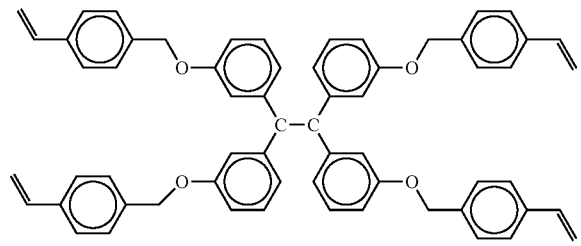

10 Claims, 2 Drawing Sheets

AROMATIC TETRAFUNCTIONAL VINYLBENZYL RESIN COMPOSITION AND USE THEREOF

CROSS-REFERENCE TO RELATED APPLICATIONS

This Application claims priority to Chinese Patent Application No. 201410736496.9, filed on Dec. 5, 2014, the entirety of which is incorporated by reference herein.

FIELD OF THE INVENTION

This invention provides a method of producing an aromatic tetrafunctional vinylbenzyl resin, a composition thereof and a use thereof.

BACKGROUND OF THE INVENTION

With the rapid advancement of electronic technology, information processing in mobile communication, servers, mainframe computers and other electronic products has incessantly directed toward high frequency signal transmission and high speed digitalization, and low dielectric resin material has therefore become the mainstream for the development of laminates for high speed data transmission in order to satisfy the demands of high speed information processing.

Conventional resin compositions for laminates generally contain epoxy resin used in conjunction with phenolic compounds, amines or acid anhydride curing agents. However, it is difficult for the laminates or printed circuit boards made from such resin compositions to achieve low dissipation factor (Df) at 10 GHz and balanced thermal resistance and thermal expansion of the laminates.

Therefore, it is desirable for skilled artisans to achieve low dissipation factor (Df) at 10 GHz and other satisfactory properties, particularly thermal expansion and thermal resistance such as Tg, T288 and solder dip resistance.

Accordingly, there is a need to provide a resin composition and its product applicable to laminates and printed circuit boards featuring low dissipation factor at high frequency and thermal resistance and thermal expansion meeting the demands.

SUMMARY OF THE INVENTION

The first object of this invention is to obtain a resin composition applicable to laminates and printed circuit boards featuring low dissipation factor at high frequency and thermal resistance and thermal expansion meeting the demands.

The second object of this invention is to obtain a product of said resin composition featuring low dissipation factor at high frequency and thermal resistance and thermal expansion meeting the demands.

The primary aspect of this invention is to provide a low dissipation factor resin composition, which comprises:

(A) an aromatic tetrafunctional vinylbenzyl monomer, its prepolymer or a combination thereof, the aromatic tetrafunctional vinylbenzyl monomer having a structure shown below:

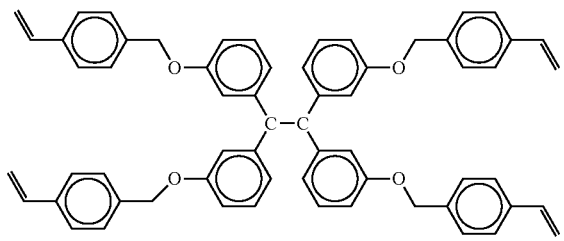

(B) flame retardant; and (C) peroxide.

In one embodiment of the present invention, the aromatic tetrafunctional vinylbenzyl prepolymer has a number average molecular weight less than 2000.

In a preferred embodiment, the aromatic tetrafunctional vinylbenzyl prepolymer has a number average molecular weight ranging from 860 to 2000.

In one embodiment, the aromatic tetrafunctional vinylbenzyl resin prepolymer is obtained and formed by heating the aromatic tetrafunctional vinylbenzyl monomer to 140° C. or above for 4 to 8 hours or heating it to 90° C. with the addition of 0.1 wt % to 0.5 wt % of the peroxide, relative to the total weight of the resin composition, for reaction for 1 to 2 hours.

An aromatic tetrafunctional vinylbenzyl prepolymer with a number average molecular weight as measured by gel permeation chromatography (GPC) less than 2000 can be obtained by controlling the temperature and time of prepolymerization.

In one embodiment, the aromatic tetrafunctional vinylbenzyl monomer and/or its prepolymer is formed by reacting a tetrafunctional phenolic monomer and/or its prepolymer with 4-chloro-methyl styrene in the presence of solvent.

In one embodiment of the present invention, the flame retardant has a structure of formula (I):

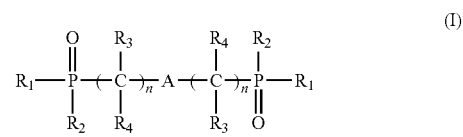

wherein A is a covalent bond, $C_6$-$C_{12}$ arylene, $C_3$-$C_{12}$ cycloalkylene or $C_6$-$C_{12}$ cycloalkenylene, and wherein the $C_3$-$C_{12}$ cycloalkylene or the $C_6$-$C_{12}$ cycloalkenylene is optionally substituted by $C_1$-$C_{12}$ alkyl;

$R_1$ and $R_2$ are the same or different and individually represent H, alkoxy, aryloxy, alkyl, aryl, or silanyl;

$R_3$ and $R_4$ are the same or different and individually represent H, hydroxyl, or $C_1$-$C_6$ alkyl, or only one of $R_3$ and $R_4$ is present and forms a carbonyl group with the carbon atom; and each n is independently a positive integer of 0 to 6 and n is not 0 when A is $C_6$-$C_{12}$ arylene or a covalent bond.

In one embodiment of the present invention, the flame retardant is

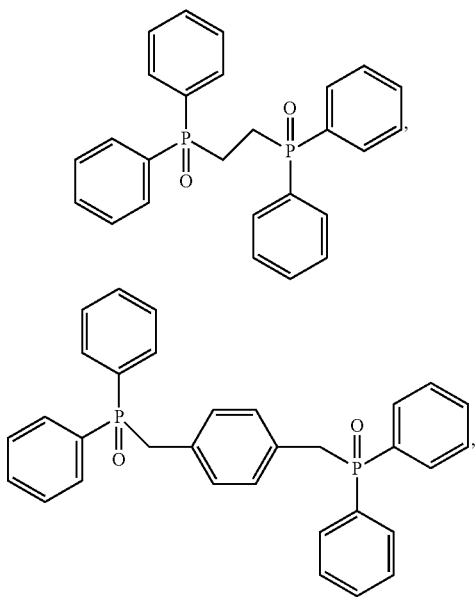

or a combination thereof.

In one embodiment of the present invention, the resin composition further comprises styrene-butadiene-divinylbenzene terpolymer, styrene-butadiene-maleic anhydride terpolymer, vinyl functional polybutadiene urethane oligomer, or a combination thereof.

In one embodiment of the present invention, the resin composition further comprises a vinyl-containing compound or a polymer thereof which comprises maleimide, divinylbenzene, bis(vinylbenzyl)ether, triallyl isocyanurate, diallyl bisphenol A, vinyl-containing polyphenylene oxide, maleimide prepolymer, a vinyl-containing polymer with a number average molecular weight (Mn) less than 1000, or a combination thereof.

In one embodiment, the vinyl-containing compound or a polymer thereof is a vinyl-containing polymer with a number average molecular weight (Mn) less than 1000, vinyl-containing polyphenylene oxide, maleimide, maleimide prepolymer, or a combination thereof.

Preferably, the vinyl-containing polymer with a number average molecular weight (Mn) less than 1000 is formed by a monomer selected from divinylbenzene, bis(vinylbenzyl) ether, triallyl isocyanurate, diallyl bisphenol A, styrene, brominated styrene, tricyclodecane dimethanol diacrylate, or a combination thereof.

Preferably, the vinyl-containing polyphenylene oxide is vinyl-benzylated polyphenylene oxide resin, vinyl-benzylated modified bisphenol A polyphenylene oxide, methacrylic polyphenylene oxide resin or a combination thereof.

In one embodiment, the vinyl-containing compound or a polymer thereof is selected from bis(vinylbenzyl)ether monomer or a polymer thereof, which comprises a monomer shown below, a prepolymer thereof or a copolymer thereof:

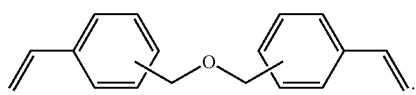

In one embodiment of the present invention, the resin composition comprises in parts by weight:

(A) 40 to 100 parts by weight of the aromatic tetrafunctional vinylbenzyl monomer, its prepolymer or a combination thereof, the aromatic tetrafunctional vinylbenzyl monomer having a structure shown below:

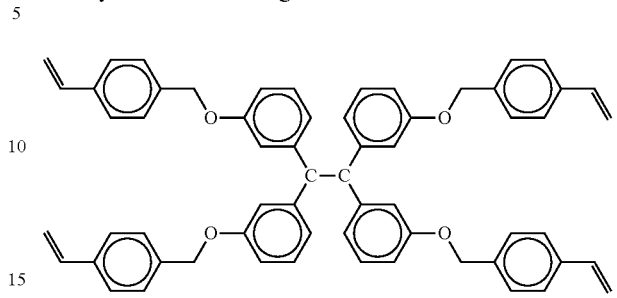

(B) 10 to 100 parts by weight of the flame retardant; and
(C) 0.1 to 10 parts by weight of the peroxide.

In a preferred embodiment of the present invention, the resin composition comprises (B) 25 to 75 parts by weight of the flame retardant.

In one embodiment of the present invention, a laminate made from the resin composition has a Df of less than or equal to 0.0060 at 10 GHz according to the JIS C2565 test method and preferably less than 0.0050.

In one embodiment of the present invention, a laminate made from the resin composition has a Tg greater than 195° C. as measured by DMA according to IPC-TM-650 2.4.24.4, a T288 greater than 60 minutes without delamination, and a solder dip test cycle greater than 20 without delamination.

Another aspect of this invention is to provide a product made by the above-mentioned low dissipation factor resin composition.

In one embodiment, the product comprises a resin film, a prepreg, a laminate, a printed circuit board, or a combination thereof.

BRIEF DESCRIPTION OF THE DRAWINGS

A more complete understanding of the subject matter can be derived by referring to the detailed description and claims when considered in conjunction with the following figures.

DETAILED DESCRIPTION OF THE INVENTION

Figure 1:
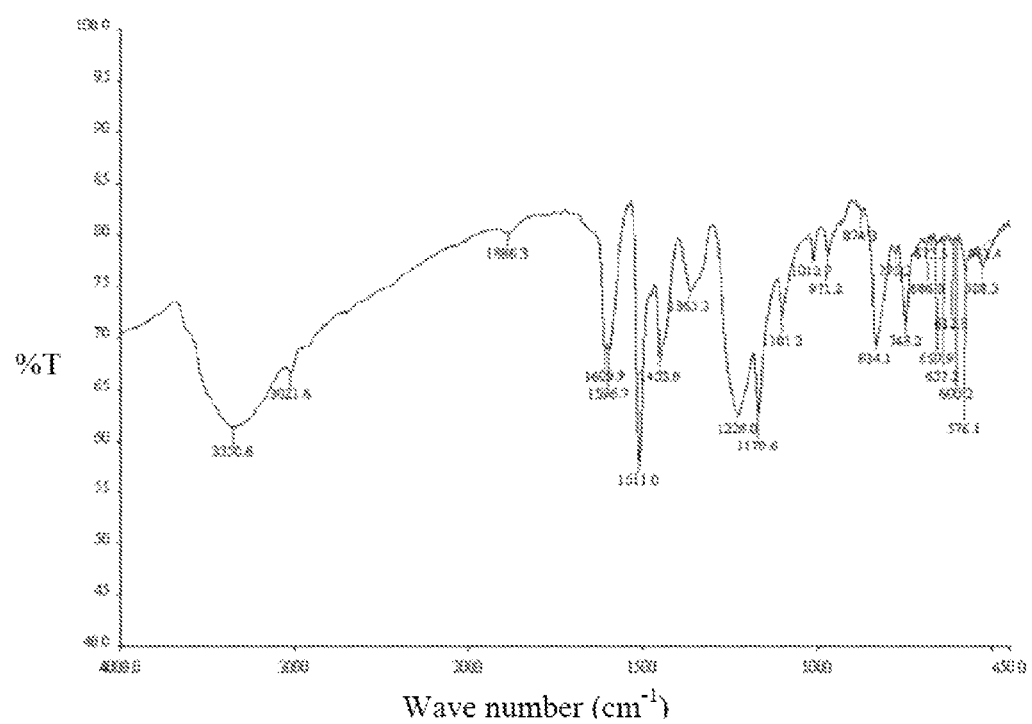
FIG. 1 illustrates the Fourier transform infrared spectroscopy (FTIR) result of TPN.

As used herein, the terms "comprises," "comprising," "includes," "including," "has," "having" and any other variation thereof indicate that different ingredients or components may be used together in the mixture or composition of this invention. Therefore, the terms "consisting essentially of" and "consisting of" are encompassed by the terms "comprises," "comprising," "includes," "including," "has," "having" and any other variation thereof.

These and other aspects of the present invention are described in detail below. Unless otherwise specified, the starting materials of the present invention may be commercially available or prepared by conventional methods known in the art. Unless otherwise defined or specified, all technical and scientific terms used herein have the same meanings known by those skilled in the art. In addition, any process or material similar or equivalent to those cited herein may be used in the present invention.

Composition

This invention provides a low dissipation factor resin composition, comprising:
(A) an aromatic tetrafunctional vinylbenzyl monomer, its prepolymer or a combination thereof, the aromatic tetrafunctional vinylbenzyl monomer having a structure shown below:

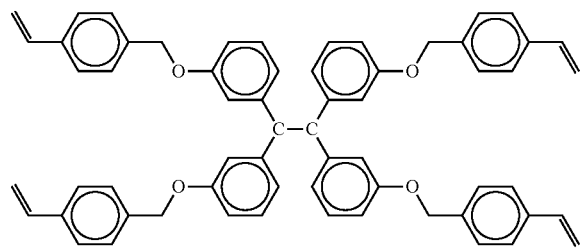

(B) flame retardant; and
(C) peroxide.

In one embodiment of the present invention, the resin composition comprises in parts by weight:
(A) 40 to 100 parts by weight of the aromatic tetrafunctional vinylbenzyl monomer, its prepolymer or a combination thereof, the aromatic tetrafunctional vinylbenzyl monomer having a structure shown below:

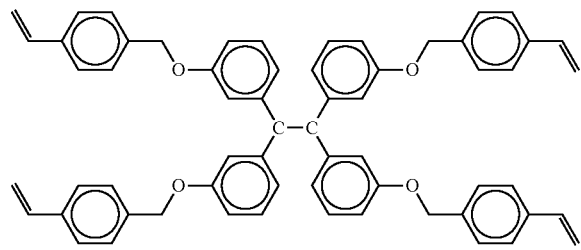

(B) 10 to 100 parts by weight of the flame retardant; and
(C) 0.1 to 10 parts by weight of the peroxide.

In a preferred embodiment of the present invention, the resin composition comprises (B) 25 to 75 parts by weight of the flame retardant.

In one embodiment of the present invention, a laminate made from the resin composition has a Df of less than or equal to 0.0060 at 10 GHz according to the JIS C2565 test method.

In one embodiment of the present invention, a laminate made from the resin composition has a Tg greater than 195° C. as measured by DMA according to IPC-TM-650 2.4.24.4, a T288 greater than 60 minutes without delamination, and a solder dip test cycle greater than 20 without delamination.

(A) Aromatic Tetrafunctional Vinylbenzyl Monomer and/or Prepolymer

The present inventors found that the component (A) and the component (B) of the present invention provide synergistic effect. The component (A) useful for the synergistic effect is described below.

In one embodiment of the present invention, the aromatic tetrafunctional vinylbenzyl prepolymer has a number average molecular weight less than 2000.

In a preferred embodiment, the aromatic tetrafunctional vinylbenzyl prepolymer has a number average molecular weight ranging from 860 to 2000.

In one embodiment, the aromatic tetrafunctional vinylbenzyl resin prepolymer is obtained by heating the aromatic tetrafunctional vinylbenzyl monomer to 140° C. or above for 4 to 8 hours or heating it to 90° C. with the addition of 0.1 wt % to 0.5 wt % of the peroxide relative to the total weight of the resin composition for reaction for 1 to 2 hours.

An aromatic tetrafunctional vinylbenzyl prepolymer with a number average molecular weight as measured by gel permeation chromatography (GPC) less than 2000 can be obtained by controlling the temperature and time of prepolymerization.

In a preferred embodiment of this invention, the aromatic tetrafunctional vinylbenzyl monomer and/or its prepolymer is formed by reacting a tetrafunctional phenol with 4-chloromethyl styrene in the presence of solvent.

One example of the tetrafunctional phenol is shown below:

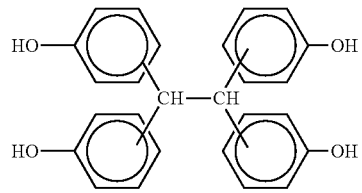

The aromatic tetrafunctional vinylbenzyl monomer has a structure shown below:

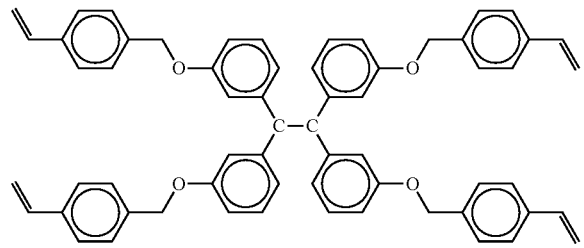

The aromatic tetrafunctional vinylbenzyl monomer and/or prepolymer according to the present invention is preferably formed by the reaction carried out in the presence of a phase transfer catalyst of N-methyl-N,N,N-trioctyloctan-1-ammonium chloride (Aliquat 336, available from Starks' Catalyst) and potassium hydroxide.

Preferably, the process for preparing the aromatic tetrafunctional vinylbenzyl monomer and/or prepolymer of this invention is followed by toluene extraction and methanol washing to remove impurities, so as to obtain higher purity of the aromatic tetrafunctional vinylbenzyl monomer and/or prepolymer.

In the process for preparing the aromatic tetrafunctional vinylbenzyl monomer and/or prepolymer of this invention, the tetrafunctional phenolic monomer or its prepolymer is commercially available such as under the trade name TPN from Nan Ya Plastics Corporation.

The aromatic tetrafunctional vinylbenzyl resin of this invention acts synergistically with the component (B) flame retardant, particularly with formula (I). Compared with tetrafunctional phenolic resin, the resin composition using aromatic tetrafunctional vinylbenzyl resin may achieve lower (better) dielectric properties.

(B) Flame Retardant

The flame retardant according to the present invention may be phosphorous-containing flame retardant or brominated flame retardant.

The brominated flame retardant is not particularly limited and preferably selected from at least one of the group consisting of: ethylene-bis(tetrabromophthalimide) (e.g. SAYTEX BT-93 commercially available from Albemarle), 1,2-bis(pentabromophenyl)ethane (e.g. SAYTEX 8010 commercially available from Albemarle), and 2,4,6-tris(2,4,6-tribromophenoxy)-1,3,5-triazine (e.g. FR-245 commercially available from ICL Industrial Products).

The phosphorous-containing flame retardant is not particularly limited and preferably selected from at least one of the group consisting of: bisphenol diphenyl phosphate, ammonium polyphosphate, hydroquinone bis-(diphenyl phosphate), bisphenol A bis-(diphenylphosphate), tri(2-carboxyethyl)phosphine (TCEP), tri(chloroisopropyl)phosphate, trimethyl phosphate (TMP), dimethyl methyl phosphonate (DMMP), resorcinol bis(dixylenyl phosphate) (RDXP, such as PX-200), phosphazene (such as SPB-100), melamine polyphosphate, 9,10-dihydro-9-oxa-10-phosphaphenanthrene-10-oxide (DOPO) and its derivative or resin, melamine cyanurate and tri-hydroxy ethyl isocyanurate. For example, the flame retardant compound may be a DOPO compound, DOPO resin (e.g. DOPO-HQ, DOPO-NQ, DOPO-PN, and DOPO-BPN), and DOPO-containing epoxy resin, wherein DOPO-BPN may be bisphenol novolac compounds such as DOPO-BPAN, DOPO-BPFN, and DOPO-BPSN. The flame retardant according to the present invention is preferably a non-reactive flame retardant, which means the flame retardant does not contain a reactive functional group in its chemical structure.

Preferably, the flame retardant according to the present invention has the structure represented by formula (I):

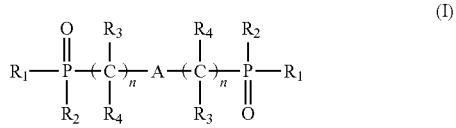

wherein A is a covalent bond, $C_6$-$C_{12}$ arylene, $C_3$-$C_{12}$ cycloalkylene or $C_6$-$C_{12}$ cycloalkenylene, and wherein the $C_3$-$C_{12}$ cycloalkylene or $C_6$-$C_{12}$ cycloalkenylene is optionally substituted by $C_1$-$C_{12}$ alkyl;

$R_1$ and $R_2$ are the same or different and individually represent H, alkoxy, aryloxy, alkyl, aryl, or silanyl; in one embodiment, $R_1$ and $R_2$ are both phenyl group;

$R_3$ and $R_4$ are the same or different and individually represent H, hydroxyl, or $C_1$-$C_6$ alkyl, or only one of $R_3$ and $R_4$ is present and forms a carbonyl group with the carbon atom; and each n is independently a positive integer of 0 to 6 and n is not 0 when A is $C_6$-$C_{12}$ arylene or a covalent bond.

The phosphorous-containing flame retardant according to the present invention preferably has a structure of formula (II) and/or (III).

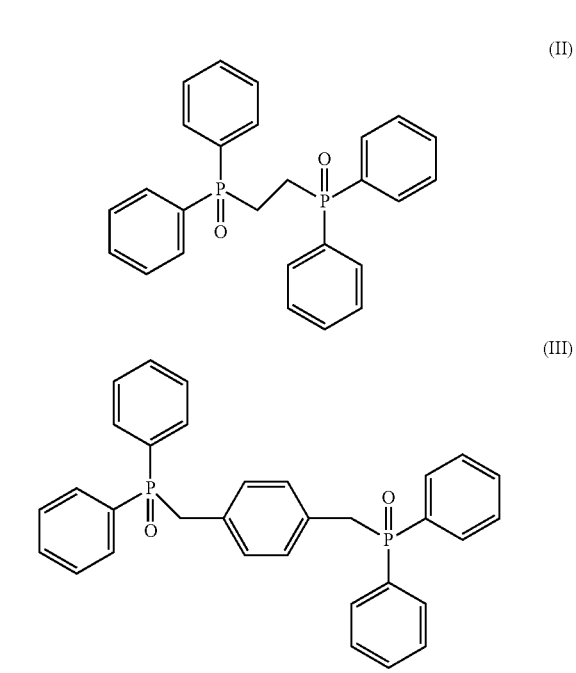

(C) Peroxide

The peroxide (C) comprises but not limited to at least one of dicumyl peroxide, tert-butyl peroxybenzoate, and di(tert-butylperoxyisopropyl)benzene.

Optional Components for Optimizing Resin Composition

In one embodiment of the present invention, the resin composition further comprises styrene-butadiene-divinylbenzene terpolymer, styrene-butadiene-maleic anhydride terpolymer, vinyl functional polybutadiene urethane oligomer, or a combination thereof.

In one embodiment of the present invention, the resin composition further comprises a vinyl-containing compound or a polymer thereof which comprises maleimide, divinylbenzene, bis(vinylbenzyl)ether, triallyl isocyanurate, diallyl bisphenol A, vinyl-containing polyphenylene oxide, maleimide prepolymer, a vinyl-containing polymer with a number average molecular weight (Mn) less than 1000, or a combination thereof.

In one embodiment, the vinyl-containing compound or a polymer thereof is a vinyl-containing polymer with a number average molecular weight (Mn) less than 1000, vinyl-containing polyphenylene oxide, maleimide, maleimide prepolymer, or a combination thereof.

Preferably, the vinyl-containing polymer with a number average molecular weight (Mn) less than 1000 is formed by a monomer selected from divinylbenzene, bis(vinylbenzyl)ether, triallyl isocyanurate, diallyl bisphenol A, styrene, brominated styrene, tricyclodecane dimethanol diacrylate, or a combination thereof.

Preferably, the vinyl-containing polyphenylene oxide is vinyl-benzylated polyphenylene oxide resin, vinyl-benzylated modified bisphenol A polyphenylene oxide, methacrylic polyphenylene oxide resin or a combination thereof.

In one embodiment, the vinyl-containing compound or a polymer thereof is selected from bis(vinylbenzyl)ether monomer or a polymer thereof, which comprises a monomer shown below, a prepolymer thereof or a copolymer thereof:

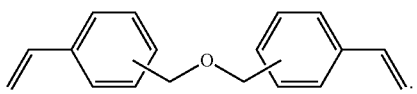

Other Useful Components

The low dissipation factor resin composition according to the present invention may further comprise at least one of the following additives: epoxy resin, curing accelerator, inorganic filler, solvent, toughener, and coupling agent.

The low dissipation factor resin composition according to the present invention may be further added with inorganic filler. The purpose of adding inorganic filler is to increase the thermal conductivity of the resin composition and improve the thermal expansion and mechanical strength, etc. Moreover, the inorganic filler is preferably uniformly distributed in the resin composition.

The inorganic filler may be any one or more selected from the group consisting of silica (fused, non-fused, porous or hollow silica), aluminum oxide, aluminum hydroxide, magnesium oxide, magnesium hydroxide, calcium carbonate, aluminum nitride, boron nitride, aluminum silicon carbide, silicon carbide, sodium carbonate, titanium dioxide, zinc oxide, zirconium oxide, quartz, diamond powder, diamond-like carbon powder, graphite, magnesium carbonate, potassium titanate, ceramic fiber, mica, boehmite, zinc molybdate, ammonium molybdate, zinc borate, calcium phosphate, calcinated talc, talc, silicon nitride, mullite, calcinated kaolin, clay, basic magnesium sulfate whisker, mullite whisker, barium sulfate, magnesium hydroxide whisker, magnesium oxide whisker, calcium oxide whisker, carbon nanotube, nano-scale silica and associated inorganic powder, and powder particles having an organic core and a shell modified by an insulator. The inorganic filler may come in the form of spherical shape, fibrous shape, sheet-like shape, particulate shape, strip-like shape, or needle-like shape, and is selectively pre-treated with a silane coupling agent.

Preferably 10 to 200 parts by weight of inorganic filler is added, which is preferably spherical nano-scale silica or poly(tetrafluoroethene) powder (PTFE powder).

The resin composition according to the present invention may be further added with epoxy resin, which is selected from bisphenol A epoxy resin, bisphenol F epoxy resin, bisphenol S epoxy resin, bisphenol AD epoxy resin, phenol novolac epoxy resin, bisphenol A novolac epoxy resin, o-cresol novolac epoxy resin, trifunctional epoxy resin, tetrafunctional epoxy resin, multifunctional epoxy resin, dicyclopentadiene (DCPD) epoxy resin, phosphorous-containing epoxy resin, p-xylene epoxy resin, naphthalene epoxy resin, benzopyran epoxy resin, biphenyl novolac epoxy resin, phenol aralkyl novolac epoxy resin and a combination thereof.

The purpose of adding curing accelerator is to increase the reaction rate of the resin composition. The purpose of adding coupling agent (also known as surfactant) is to ensure uniform distribution of the inorganic filler in the resin composition and to avoid aggregation of the inorganic filler. The purpose of adding toughener is to improve the toughness of the resin composition. The purpose of adding solvent is to change the solid content of the resin composition and to adjust the viscosity of the resin composition.

Preferably, the use amounts of the curing accelerator, coupling agent, toughener and solvent are 0.01 to 5 parts by weight, 0.001 to 0.1 part by weight, 5 to 50 parts by weight, and 50 to 300 parts by weight, respectively.

The resin composition can be optionally added with one or more curing accelerators to increase the curing rate. Any curing accelerator capable of increasing the curing rate of the low dissipation factor resin composition of this invention is useful.

The resin composition may comprise a catalyst, such as a Lewis base or a Lewis acid. The Lewis base includes imidazole, boron trifluoride amine complex, ethyltriphenyl phosphonium chloride, 2-methylimidazole, 2-phenylimidazole, 2-ethyl-4-methylimidazole, triphenylphosphine, and/or 4-dimethylaminopyridine. The Lewis acid comprises a metal salt compound, such as a manganese, iron, cobalt, nickel, copper, or zinc metal salt compound, preferably a metal catalyst such as zinc caprylate or cobalt caprylate.

The coupling agent may be silane and/or siloxane compound.

Preferably, the coupling agent is at least one of an amino silane compound, an amino siloxane compound, a styrene-based silane compound, a styrene-based siloxane compound, an acrylic silane compound, an acrylic siloxane compound, a methacrylic silane compound, a methacrylic siloxane compound, an alkyl silane compound and an alkyl siloxane compound.

The toughener may be rubber resin, carboxyl-terminated polybutadiene acrylonitrile, and/or core-shell polymer.

The solvent may comprise at least one selected from the group consisting of methanol, ethanol, ethylene glycol methyl ether, acetone, methyl ethyl ketone, methyl isobutyl ketone, cyclohexanone, toluene, xylene, methoxyethyl acetate, ethoxyethyl acetate, propoxyethyl acetate, ethyl acetate, dimethylformamide, propylene glycol methyl ether, gamma-butyrolactone (GBL) and diisobutyl ketone (DIBK).

Product

Another aspect of this invention is to provide a product made from the above-mentioned low dissipation factor resin composition.

In one embodiment, the product comprises a resin film, a prepreg, a laminate, a printed circuit board, or a combination thereof.

Another object of this invention is to provide a resin film which comprises the above-mentioned resin composition. The resin film may be coated on a polyester film (PET film) or a polyimide film (PI film) or coated on a copper foil, followed by heating and baking to the B-stage to form a resin coated copper (RCC).

Yet another object of this invention is to provide a prepreg which may comprise a reinforcement material and the above-mentioned resin composition adhered onto the reinforcement material by impregnation and heated at high temperature to a semi-cured state. The reinforcement material may be fiber material, woven fabric, and non-woven fabric, such as a fiberglass fabric, which is useful for increasing the mechanical strength of the prepreg. Moreover, the reinforcement material may be optionally pre-treated by a saline coupling agent.

Still another object of this invention is to provide a laminate, such as a metallic foil clad laminate, which comprises two or more metal foils and at least one insulation layer. The metal foil may be for example a copper foil and may further contain at least one metal alloy such as aluminum, nickel, platinum, silver, gold, etc.; the insulation layer is formed by curing the prepreg or resin film under high temperature and high pressure, such as by superimposing the prepreg between two metal foils and performing lamination under high temperature and high pressure.

Another object of this invention is to provide a printed circuit board which comprises at least one such laminate, wherein the circuit board may be prepared by conventional processes.

Preferred Embodiment

This invention discloses a low dissipation factor resin composition, preferably comprising: (A) an aromatic tetrafunctional vinylbenzyl monomer, its prepolymer or a combination thereof, the aromatic tetrafunctional vinylbenzyl monomer having a structure shown below:

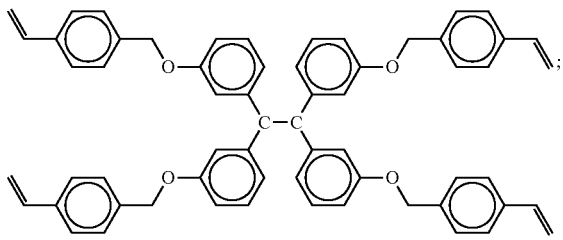

(B) flame retardant;
(C) peroxide; and
(D) styrene-butadiene-divinylbenzene terpolymer, styrene-butadiene-maleic anhydride terpolymer, polybutadiene-urethane-methacrylic, or a combination thereof.

The resin composition may further comprise vinyl-benzylated polyphenylene oxide resin (e.g. OPE-2st) and/or methacrylic polyphenylene oxide resin (e.g. SA-9000).

The embodiments below further disclose and describe the present invention so as to enable persons skilled in the art to make and use the present invention accordingly. However, the embodiments below are illustrative, rather than restrictive, of the present invention. All equivalent modifications and changes made to the embodiments below by persons skilled in the art without departing from the spirit embodied in the present invention shall fall within the scope of the present invention.

Due to the disclosure of this invention, other aspects of this invention are readily comprehensible to persons skilled in the art.

The present invention will now be illustrated in conjunction with the following embodiments. In the examples and embodiments below, experimental processes without specified conditions are usually carried out according to national standards; if there is no corresponding national standards, generally acceptable international standards, routine conditions or conditions proposed by manufacturers are followed. In addition, unless otherwise specified, all parts and percentages are by weight, and the molecular weight of a polymer is a number average molecular weight.

Unless otherwise defined or specified, all technical and scientific terms used herein have the same meanings known by those skilled in the art. In addition, any process or material similar or equivalent to those cited herein may be used in the present invention.

EXAMPLE

Chemicals used in the preparatory examples, examples and comparative examples are listed below.

Aliquat 336: methyl trioctyl ammonium chloride, available from Starks' Catalyst

BMI-2300: bismaleimide resin, available from Daiwakasei Industry Co. Ltd.

OPE-2st: vinylbenzyl-terminated diphenyl polyphenylene oxide resin, available from Mitsubishi Gas Chemical Co., Inc.

SA-9000: methacrylate-terminated bisphenol A polyphenylene oxide resin, available from Sabic 8010: decabromodiphenyl ethane flame retardant, available from Albemarle SPB-100: phosphazene, available from Otsuka Chemical Co., Ltd.

Ricon257: styrene-butadiene-divinylbenzene terpolymer, available from Cray Valley R-45vt: vinyl functional polybutadiene urethane oligomer, available from Cray Valley Ricon184MA6: styrene-butadiene-maleic anhydride terpolymer, available from Cray Valley 25B: 2,5-dimethyl-2,5-di(tert-butylperoxy)-3-hexyne, available from NOF Corporation SQ-5500: spherical silica, available from Admatechs SP3: poly(tetrafluoroethene) powder, available from Admatechs TPN: tetrafunctional phenol, available from Nan Ya Plastics Corporation TAIC: triallyl isocyanurate, available from Sigma Aldrich 188: bisphenol A epoxy resin, available from Chang Chun Plastics. Co. Ltd.

To fully illustrate the purposes, features and effects, the present invention is described in detail through the examples and embodiments below in conjunction with the accompanying drawings.

Preparatory Example 1

One approach for preparing the aromatic tetrafunctional vinylbenzyl resin is described below.

Add 26.5 g of CMS-P (4-chloro-methyl styrene, mixture of isomers: para/meta=7:3) and 25 g of TPN into a reaction tank and then stir at a temperature of 50 to 90° C. Add 12 g of potassium hydroxide and 0.5 g of N-methyl-N,N,N-trioctyloctan-1-ammonium chloride and keep stirring for 4 hours, followed by washing with toluene to obtain the aromatic tetrafunctional vinylbenzyl resin as an brown liquid solution (aromatic tetrafunctional vinylbenzyl ether resin and toluene).

Examine and analyze the aromatic tetrafunctional vinylbenzyl resin with FTIR to obtain the result as shown in the accompanying figures.

Figure 2:
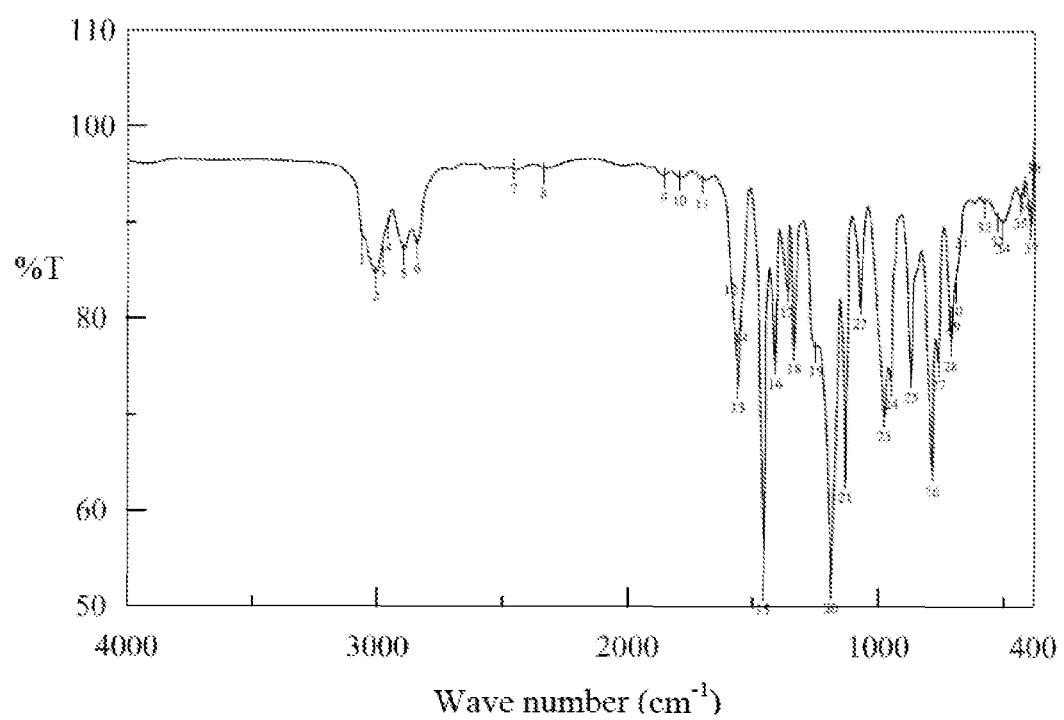
FIG. 2 illustrates the FTIR result of the aromatic tetrafunctional vinylbenzyl ether resin.

FIG. 1 is the FTIR result of TPN, and FIG. 2 is the FTIR result of the aromatic tetrafunctional vinylbenzyl resin as tabulated below. The comparison of the two figures illustrates that the reaction product aromatic tetrafunctional vinylbenzyl resin has an increased characteristic peak at 900 to 1000 $cm^{-1}$, representing the vinyl group formed after the reaction and the completion of the reaction.

| No. | Position | Intensity | No. | Position | Intensity | No. | Position | Intensity |
|---|---|---|---|---|---|---|---|---|
| 1 | 3085.55 | 87.9590 | 2 | 3031.55 | 84.3570 | 3 | 3006.48 | 86.7828 |
| 4 | 2979.48 | 89.6052 | 5 | 2921.63 | 87.1389 | 6 | 2867.63 | 87.6689 |
| 7 | 2476.15 | 95.3351 | 8 | 2360.44 | 95.0200 | 9 | 1884.11 | 94.5335 |
| 10 | 1824.33 | 94.2293 | 11 | 1735.62 | 93.9007 | 12 | 1627.63 | 84.8606 |
| 13 | 1606.41 | 69.1426 | 14 | 1583.27 | 79.9473 | 15 | 1508.06 | 51.3377 |
| 16 | 1454.06 | 75.0972 | 17 | 1405.85 | 82.2191 | 18 | 1376.93 | 76.6503 |
| 19 | 1288.22 | 76.2408 | 20 | 1240 | 50.8390 | 21 | 1176.36 | 63.1619 |
| 22 | 1108.87 | 81.0100 | 23 | 1014.37 | 69.2319 | 24 | 991.232 | 72.6085 |
| 25 | 908.308 | 73.3959 | 26 | 829.241 | 64.3866 | 27 | 796.457 | 74.8437 |
| 28 | 748.245 | 76.7236 | 29 | 730.889 | 81.2069 | 30 | 713.533 | 81.2695 |
| 31 | 696.177 | 88.5751 | 32 | 605.539 | 90.7581 | 33 | 557.327 | 89.6085 |
| 34 | 534.185 | 88.7194 | 35 | 460.904 | 90.7173 | 36 | 441.619 | 92.6886 |
| 37 | 418.477 | 88.2958 | 38 | 404.978 | 97.0248 | | | |

Result of Peak Picking of FIG. 2

Preparatory Example 2

Heat 45 g of TAIC and 30 g of BMI-2300 and control the melting temperature between 100 and 150° C. After BMI and TAIC have formed a uniform solution, lower the temperature to 50° C., add 100 g of the tetrafunctional vinylbenzyl resin (product from Preparatory Example 1) and about 50 g of toluene, followed by stirring the resulting mixture till to room temperature to give a uniform tetrafunctional vinylbenzyl resin prepolymer (Compound A), which has a solid content of about 65%.

Preparation of DPPO Derivative

Mix and stir 206 g of diphenylphosphine oxide (DPPO), 90 g of dichloro-p-xylene and 1200 g of 1,2-dichlorobenzene. Heat the reaction in nitrogen atmosphere at 160° C. for 12 to 24 hours. Cool to the room temperature and filter, followed by drying under vacuum to obtain the phosphorous-containing flame retardant of formula (III) as white powder with a phosphorous content of about 12%.

The resin composition of each embodiment and the laminate properties thereof are listed in the tables below, including Examples E1 to E17 and Comparative Examples C0 to C16.

| Component | | E1 | E2 | C0 | E3 | E4 | E5 |
|---|---|---|---|---|---|---|---|
| high melting point phosphorous-containing flame retardant | DPPO derivate | 35 | 35 | | 35 | | 25 |
| phosphazene | SPB-100 | | | | | | 10 |
| decabromodiphenyl ethane | 8010 | | | | | 35 | |
| tetrafunctional vinylbenzyl resin prepolymer | Compound A | | | | 100 | | |
| vinyl-benzylated polyphenylene oxide | OPE-2st | | 50 | | | | |
| tetrafunctional vinylbenzyl resin | Tetra BVE | 100 | 50 | 100 | | 100 | 100 |
| maleimide | BMI2300 | | | | | | |
| tetrafunctional phenol | TPN | | | | | | |
| peroxide | 25B | 0.9 | 0.9 | 0.9 | 0.9 | 0.9 | 0.9 |
| spherical silica | SQ-5500 | 60 | 60 | 60 | 60 | 60 | 60 |
| toluene | | 100 | 100 | 100 | 100 | 100 | 100 |
| MEK | | 30 | 30 | 30 | 30 | 30 | 30 |

| Component | | C1 | C2 | C3 | C4 | E16 |
|---|---|---|---|---|---|---|
| high melting point phosphorous-containing flame retardant | DPPO derivate | 35 | 35 | 35 | 35 | |
| phosphazene | SPB-100 | | | | | 35 |
| decabromodiphenyl ethane | 8010 | | | | | |
| tetrafunctional vinylbenzyl resin prepolymer | Compound A | | | | | |
| vinyl-benzylated polyphenylene oxide | OPE-2st | 100 | | 50 | 50 | |
| tetrafunctional vinylbenzyl resin | Tetra BVE | | | | | 100 |
| maleimide | BMI2300 | | 100 | 50 | | |
| tetrafunctional phenol | TPN | | | | 50 | |
| peroxide | 25B | 0.9 | 0.9 | 0.9 | 0.9 | 0.9 |
| spherical silica | SQ-5500 | 60 | 60 | 60 | 60 | 60 |
| toluene | | 100 | 100 | 100 | 100 | 100 |
| MEK | | 30 | 30 | 30 | 30 | 30 |

-continued

| Test item (method) | Unit | E1 | E2 | C0 | E3 | E4 | E5 |
|---|---|---|---|---|---|---|---|
| Tg (DMA) | °C. | 203 | 200 | 202 | 220 | 203 | 198 |
| Dimension change (TMA) | % | 2.61 | 2.24 | 2.5 | 2.05 | 2.01 | 2.11 |
| T288 (TMA) | minute | >60 | >60 | 15 | >60 | >60 | >60 |
| S/D | cycle | >20 | >20 | >20 | >20 | >20 | >20 |
| Dk@10 GHz | NA | 3.45 | 3.41 | 3.42 | 3.42 | 3.41 | 3.43 |
| Df@10 GHz | NA | 0.0045 | 0.0039 | 0.0042 | 0.0037 | 0.0045 | 0.0046 |
| UL94 | NA | V-0 | V-0 | burn out | V-0 | V-0 | V-0 |

| Test item (method) | Unit | C1 | C2 | C3 | C4 | E16 |
|---|---|---|---|---|---|---|
| Tg (DMA) | °C. | 200 | 232 | 220 | 190 | 198 |
| Dimension change (TMA) | % | 2.85 | 1.55 | 2.15 | 2.55 | 3.03 |
| T288 (TMA) | minute | >60 | >60 | >60 | 30 | >60 |
| S/D | cycle | >20 | >20 | >20 | 15 | >20 |
| Dk@10 GHz | NA | 3.69 | 3.88 | 3.75 | 4.05 | 3.56 |
| Df@10 GHz | NA | 0.0055 | 0.0075 | 0.0061 | 0.0101 | 0.0059 |
| UL94 | NA | V-0 | V-0 | V-0 | V-0 | V-1 |

| Component | | E6 | E7 | E8 | E9 | E10 | E11 | E12 | E13 | E14 | E15 | E17 |
|---|---|---|---|---|---|---|---|---|---|---|---|---|
| tetra(vinylbenzyl) ether prepolymer | Compound A | | | | | | | 90 | 60 | 100 | 100 | 60 |
| high melting point phosphorous-containing flame retardant | DPPO derivate | 35 | 45 | 45 | 45 | 45 | 45 | 45 | | 70 | 30 | 45 |
| vinyl-benzylated polyphenylene oxide | OPE-2st | | | | | | | 10 | 65 | | | 30 |
| | SA-9000 | | | | | | | | | | | 35 |
| tetra(vinylbenzyl) ether | Tetra BVE | 100 | 100 | 100 | 100 | 100 | 100 | | 40 | | | 100 |
| styrene-butadiene-divinylbenzene terpolymer | Ricon257 | | 30 | 15 | 15 | | 15 | | | 35 | 15 | 15 |
| polybutadiene-urethane-methacrylic | R-45vt | | | | 7 | | | | | | | |
| styrene-butadiene-maleic anhydride terpolymer | Ricon184MA6 | | 7.5 | 15 | 15 | | 15 | | | 7.5 | 7.5 | 15 |
| TAIC maleimide | BMI2300 | | | | | 50 | 15 | | | | | 15 |
| tetrafunctional phenol | TPN | | | | | | | | | | | |
| epoxy resin | 188 | | | | | | | | | | | |
| peroxide | 25B | 0.9 | 0.9 | 0.9 | 0.9 | 0.9 | 0.9 | 0.9 | 0.9 | 0.9 | 0.9 | 0.9 |
| spherical silica | SQ-5500 | 60 | 60 | 60 | 60 | 60 | 60 | 60 | 60 | 60 | 60 | 60 |
| PTFE | SP3 | 10 | 10 | 10 | 10 | 10 | 10 | 10 | 10 | 10 | 10 | 10 |
| toluene | | 100 | 100 | 100 | 100 | 100 | 100 | 100 | 100 | 100 | 100 | 100 |
| MEK | | 30 | 30 | 30 | 30 | 30 | 30 | 30 | 30 | 30 | 30 | 30 |

| Test item (method) | Unit | E6 | E7 | E8 | E9 | E10 | E11 |
|---|---|---|---|---|---|---|---|
| Tg (DMA) | °C. | 203 | 201 | 199 | 205 | 245 | 225 |
| Dimension change (TMA) | % | 2.61 | 2.65 | 2.58 | 2.57 | 1.66 | 1.96 |
| T288 (TMA) | minute | >60 | >60 | >60 | >60 | >60 | >60 |
| S/D | cycle | >20 | >20 | >20 | >20 | >20 | >20 |
| Dk@10 GHz | NA | 3.45 | 3.41 | 3.42 | 3.42 | 3.65 | 3.54 |
| Df@10 GHz | NA | 0.0045 | 0.0037 | 0.0037 | 0.0042 | 0.0056 | 0.0051 |
| UL94 | NA | V-0 | V-0 | V-0 | V-0 | V-0 | V-0 |

| Test item (method) | Unit | E12 | E13 | E14 | E15 | E17 |
|---|---|---|---|---|---|---|
| Tg (DMA) | °C. | 203 | 201 | 208 | 208 | 209 |
| Dimension change (TMA) | % | 2.15 | 2.15 | 2.05 | 2.05 | 2.04 |
| T288 (TMA) | minute | >60 | >60 | >60 | >60 | >60 |
| S/D | cycle | >20 | >20 | >20 | >20 | >20 |
| Dk@10 GHz | NA | 3.42 | 3.39 | 3.39 | 3.4 | 3.44 |
| Df@10 GHz | NA | 0.0038 | 0.0035 | 0.0037 | 0.0039 | 0.0041 |
| UL94 | NA | V-0 | burn out | V-0 | V-1 | V-0 |

| Component | | C5 | C6 | C7 | C8 | C9 | C10 | C11 | C12 | C13 | C14 | C15 | C16 |
|---|---|---|---|---|---|---|---|---|---|---|---|---|---|
| tetra(vinylbenzyl) ether prepolymer | Compound A | 100 | | 20 | | | | | | | | | |
| high melting point phosphorous-containing flame retardant | DPPO derivate | 70 | 70 | 50 | 35 | 45 | 35 | 45 | 35 | | 35 | 70 | 35 |
| vinyl-benzylated polyphenylene oxide | OPE-2st | | | | 100 | 100 | 70 | 100 | 100 | 100 | | | 100 |
| tetra(vinylbenzyl) ether | Tetra BVE | | | | | | | | | 35 | | | |
| styrene-butadiene-divinylbenzene terpolymer | Ricon257 | 35 | 35 | | | 30 | | | 15 | | | 35 | |
| polybutadiene-urethane-methacrylic | R-45vt | | | | | | 7.5 | | | 20 | | 7.5 | 7.5 |
| styrene-butadiene-maleic anhydride terpolymer | Ricon184MA6 | 7.5 | 7.5 | | | 7.5 | | | 15 | | | | |
| TAIC | | 35 | 35 | | | 35 | | | | | | 35 | 35 |
| maleimide | BMI2300 | | 100 | | | | 30 | 50 | 100 | | | | |
| tetrafunctional phenol epoxy resin | TPN 188 | | | | | | | | | | 100 | 100 | 35 |
| peroxide | 25B | 0.9 | 0.9 | 0.9 | 0.9 | 0.9 | 0.9 | 0.9 | 0.9 | 0.9 | 0.9 | 0.9 | 0.9 |
| spherical silica | SQ-5500 | 60 | 60 | 60 | 60 | 60 | 60 | 60 | 60 | 60 | 60 | 60 | 60 |
| PTFE | SP3 | 10 | 10 | 10 | 10 | 10 | 10 | 10 | 10 | 10 | 10 | 10 | 10 |
| toluene | | 100 | 100 | 100 | 100 | 100 | 100 | 100 | 100 | 100 | 100 | 100 | 100 |
| MEK | | 30 | 30 | 30 | 30 | 30 | 30 | 30 | 30 | 30 | 30 | 30 | 30 |

| Test item (method) | Unit | C5 | C6 | C7 | C8 | C9 | C10 |
|---|---|---|---|---|---|---|---|
| Tg (DMA) | ° C. | 220 | 225 | 175 | 200 | 200 | 220 |
| Dimension change (TMA) | % | 1.64 | 1.54 | 2.54 | 2.85 | 2.75 | 2.02 |
| T288 (TMA) | minute | >60 | >60 | 15 | >60 | >60 | >60 |
| S/D | cycle | >20 | >20 | 3 | >20 | >20 | >20 |
| Dk@10 GHz | NA | 3.55 | 3.85 | 3.88 | 3.69 | 3.78 | 3.88 |
| Df@10 GHz | NA | 0.0051 | 0.0071 | 0.0058 | 0.0055 | 0.0058 | 0.0059 |
| UL94 | NA | V-0 | V-0 | V-0 | V-0 | V-0 | V-1 |

| Test item (method) | Unit | C11 | C12 | C13 | C14 | C15 | C16 |
|---|---|---|---|---|---|---|---|
| Tg (DMA) | ° C. | 205 | 220 | 205 | 163 | 171 | 189 |
| Dimension change (TMA) | % | 2.12 | 2.95 | 2.65 | 3.15 | 3.65 | 3.15 |
| T288 (TMA) | minute | >60 | >60 | 30 | 5 | 15 | 25 |
| S/D | cycle | >20 | >20 | 9 | 2 | 10 | 8 |
| Dk@10 GHz | NA | 3.85 | 3.84 | 3.82 | 4.02 | 4.12 | 3.92 |
| Df@10 GHz | NA | 0.0057 | 0.0070 | 0.0077 | 0.0107 | 0.0117 | 0.0107 |
| UL94 | NA | V-0 | V-0 | burn out | V-0 | V-0 | V-0 |

Resin compositions of the examples and comparative examples listed above were well mixed in a stirred tank separately and then placed in an impregnation tank, and fiberglass fabrics (2116 type) were individually passed through the impregnation tank to impregnate the fiberglass fabrics with the resin compositions respectively, followed by heating and baking to a semi-cured state to obtain prepregs.

From the prepregs prepared batchwise above, four prepregs from the same batch were covered by two 18 μm copper foils from the top and bottom and subjected to a lamination process under vacuum at 210° C. for 2 hours to form a copper-clad laminate, in which the four prepregs were cured to form the insulation layers between the two copper foils.

The copper-clad laminates obtained above and copper-free laminates obtained by etching were subjected to physical property tests, wherein the copper-free laminates containing four laminated prepregs have a resin content of about 55%. For dielectric constant and dissipation factor analysis, laminates made from two prepregs without copper foil were tested; for other test items, laminates made from four prepregs without copper foil were tested. Physical properties tested include: glass transition temperature (Tg, measured by DMA), thermal expansion (CTE z-axis, dimensional change: 50 to 260° C., measured by TMA, %; lower dimensional change percentage is more preferred), thermal resistance (T288, measured by TMA), copper-clad laminate solder dip test (S/D, 288° C., 10 seconds, thermal resistance cycle measurement), dielectric constant (Dk, measured by an AET's microwave dielectrometer; lower Dk represents a better dielectric property), dissipation factor (Df, measured by an AET's microwave dielectrometer; lower Df represents a better dielectric property), and flame retardancy (flaming test, UL94, wherein V-0 is superior to V-1, V-1 is superior to V-2, and burning out refers to out of specification).

It can be observed from the test results of the Examples and the Comparative Examples that: (1) the aromatic tetrafunctional vinylbenzyl resin used in conjunction with flame retardant and peroxide may achieve lower dissipation factor for the laminate at high frequency and may balance thermal expansion and thermal resistance (Tg, T288 and solder dip); (2) comparisons between Example 1 and Comparative Example 2 and between Example 2 and Comparative Example 3 reveal that, instead of using an ordinary maleimide, using the aromatic tetrafunctional vinylbenzyl resin may achieve significantly lower Dk and Df and satisfactory Tg; and (3) with the addition of BMI, E10 and E11 achieve better Tg but higher Dk and Df.

The above detailed description is merely illustrative of the preferred embodiments of this invention and is not intended to limit the scope of this invention, which is broadly defined by the claims set forth below. Technical solutions, implementations or processes accomplished by others will be considered to fall within the scope of the claims if they are completely identical to those defined in the appended claims or are equivalent modifications of this invention.

All references cited in this invention are incorporated by reference in their entirety, as if they were referenced individually. In addition, it is understood that after reading this specification, skilled artisans appreciate that various changes and modifications are possible, but these equivalents shall also fall within the scope of the appended claims.

What is claimed is:

1. A low dissipation factor resin composition, comprising the following components:
    (A) an aromatic tetrafunctional vinylbenzyl prepolymer formed by reacting triallyl isocyanurate, bismaleimide and an aromatic tetrafunctional vinylbenzyl monomer having a structure shown below:

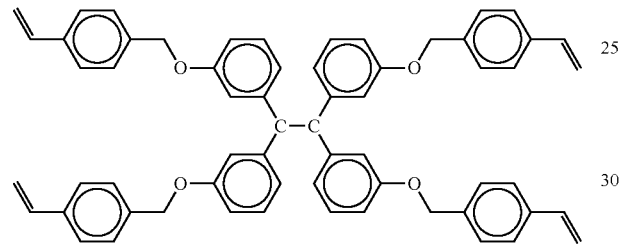

(B) flame retardant; and
    (C) peroxide.

2. The low dissipation factor resin composition of claim 1, wherein the aromatic tetrafunctional vinylbenzyl prepolymer has a number average molecular weight less than 2000.

3. The low dissipation factor resin composition of claim 1, wherein the flame retardant has a structure of formula (I):

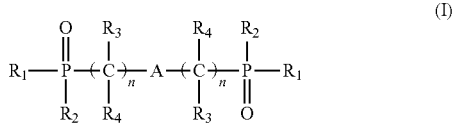

wherein A is a covalent bond, $C_6$-$C_{12}$ arylene, $C_3$-$C_{12}$ cycloalkylene or $C_6$-$C_{12}$ cycloalkenylene, and wherein the $C_3$-$C_{12}$ cycloalkylene or the $C_6$-$C_{12}$ cycloalkenylene is optionally substituted by $C_1$-$C_{12}$ alkyl;

$R_1$ and $R_2$ are the same or different and individually represent hydrogen, alkoxy, aryloxy, alkyl, aryl, or silanyl;

$R_3$ and $R_4$ are the same or different and individually represent hydrogen, hydroxyl, or $C_1$-$C_6$ alkyl, or only one of $R_3$ and $R_4$ is present and forms a carbonyl group with the carbon atom; and each n is independently a positive integer of 0 to 6 and n is not 0 when A is $C_6$-$C_{12}$ arylene or a covalent bond.

4. The low dissipation factor resin composition of claim 1, wherein the flame retardant is

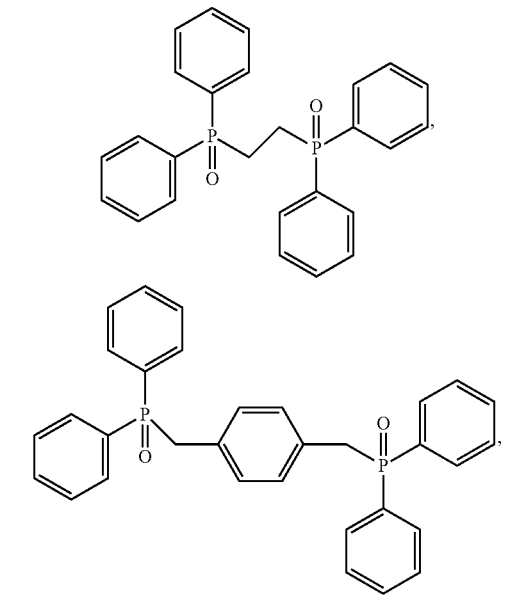

or a combination thereof.

5. The low dissipation factor resin composition of claim 1, further comprising styrene-butadiene-divinylbenzene terpolymer, styrene-butadiene-maleic anhydride terpolymer, vinyl functional polybutadiene urethane oligomer, or a combination thereof.

6. The low dissipation factor resin composition of claim 1, further comprising a vinyl-containing compound or a polymer thereof which comprises maleimide, divinylbenzene, bis(vinylbenzyl) ether, triallyl isocyanurate, diallyl bisphenol A, vinyl-containing polyphenylene oxide, maleimide prepolymer, a vinyl-containing polymer with a number average molecular weight less than 1000, or a combination thereof.

7. The low dissipation factor resin composition of claim 1, comprising in parts by weight:
    (A) 40 to 100 parts by weight of the aromatic tetrafunctional vinylbenzyl prepolymer
    (B) 10 to 100 parts by weight of the flame retardant; and
    (C) 0.1 to 10 parts by weight of the peroxide.

8. A product made from the low dissipation factor resin composition of claim 1, which comprises a resin film, a prepreg, a laminate or a printed circuit board.

9. The product of claim 8, wherein the laminate or the printed circuit board has a dissipation factor of less than or equal to 0.0060 at 10 GHz.

10. The product of claim 8, wherein the laminate or the printed circuit board has a glass transition temperature greater than 195° C. as measured by DMA according to IPC-TM-650 2.4.24.4, a T288 greater than 60 minutes without delamination, and a solder dip test cycle greater than 20 without delamination.

* * * * *